United States Patent
Nguyen et al.

(10) Patent No.: US 9,438,249 B1
(45) Date of Patent: Sep. 6, 2016

(54) RESONANT CIRCUIT TEMPERATURE COMPENSATION

(71) Applicant: QUALCOMM Incorporated, San Diego, CA (US)

(72) Inventors: Thinh Cat Nguyen, San Jose, CA (US); Jeongsik Yang, San Jose, CA (US); Ara Bicakci, Belmont, CA (US); Shen Wang, Palo Alto, CA (US); Anup Savla, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/860,027

(22) Filed: Sep. 21, 2015

(51) Int. Cl.
H03L 1/02 (2006.01)
H03B 5/04 (2006.01)

(52) U.S. Cl.
CPC .................................. *H03L 1/023* (2013.01)

(58) Field of Classification Search
CPC ........................................................ H03L 1/02
USPC ...................................... 331/176, 117 R, 167
See application file for complete search history.

(56) References Cited

U.S. PATENT DOCUMENTS

| | | | |
|---|---|---|---|
| 4,978,930 A | 12/1990 | Suter | |
| 6,504,443 B1* | 1/2003 | Eguizabal | H03J 3/185 331/177 V |
| 7,336,138 B2 | 2/2008 | Kitamura et al. | |
| 2002/0180544 A1* | 12/2002 | Fukayama | H03B 5/04 331/176 |
| 2005/0174184 A1* | 8/2005 | Wu | H03B 5/04 331/176 |
| 2006/0022763 A1* | 2/2006 | Kato | H03B 5/368 331/176 |
| 2007/0222532 A1* | 9/2007 | Takeuchi | H03B 5/04 331/176 |
| 2008/0007363 A1* | 1/2008 | Nagatomo | H03L 1/022 331/176 |
| 2009/0261917 A1 | 10/2009 | Taghivand et al. | |
| 2015/0349712 A1* | 12/2015 | Hung | H03B 5/1212 331/117 R |
| 2015/0357977 A1* | 12/2015 | Bonaccio | H03B 5/10 331/117 FE |

FOREIGN PATENT DOCUMENTS

WO WO-2009052289 A1 4/2009
WO WO-2009156793 A1 12/2009

OTHER PUBLICATIONS

Chen H., et al., "A 2 GHz VCO with Process and Temperature Compensation," Proceedings of the 1999 IEEE International Symposium on Circuits and Systems, 1999, vol. 2, pp. II-569 to II-572.
You Y., et al., "A 12GHz 67% Tuning Range 0.37pS RJrms PLL with LC-VCO Temperature Compensation Scheme on 0.13 μm CMOS," IEEE Radio Frequency Integrated Circuits Symposium, 2014, pp. 101-104.

* cited by examiner

*Primary Examiner* — Joseph Chang
(74) *Attorney, Agent, or Firm* — Patterson & Sheridan, L.L.P.

(57) ABSTRACT

Certain aspects of the present disclosure provide methods and apparatus for temperature-dependent adjustment of a resonant circuit, such as that found in a voltage-controlled oscillator (VCO). Such adjustment may be performed in an effort to compensate for the frequency drift of the resonant circuit due to temperature changes. One example adjustment circuit for temperature-dependent adjustment of a resonant circuit generally includes at least one varactor and two sets of semiconductor devices configured to apply, across the at least one varactor, a differential adjustment voltage based on an ambient temperature of the semiconductor devices to adjust a capacitance of the at least one varactor, wherein each device in the sets of semiconductor devices has a temperature-dependent junction and wherein the two sets of semiconductor devices are configured such that voltage changes of the temperature-dependent junctions in the two sets of semiconductor devices are added in the differential adjustment voltage.

30 Claims, 12 Drawing Sheets

RESONANT CIRCUIT TEMPERATURE COMPENSATION

TECHNICAL FIELD

Certain aspects of the present disclosure generally relate to electronic circuits and, more particularly, to temperature-dependent adjustment of a resonant circuit, such as that found in a voltage-controlled oscillator (VCO).

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a WLAN (Wireless Local Area Network) or a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System—Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, $3^{rd}$ Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

SUMMARY

Certain aspects of the present disclosure generally relate to temperature-dependent adjustment of a resonant circuit. Such adjustment may be performed in an effort to compensate for the frequency drift of the resonant circuit due to temperature changes.

Certain aspects of the present disclosure provide an adjustment circuit for temperature-dependent adjustment of a resonant circuit. The adjustment circuit generally includes at least one varactor having a first terminal and a second terminal; a first set of one or more semiconductor devices connected with the first terminal and configured to generate a first adjustment voltage; and a second set of one or more semiconductor devices connected with the second terminal and configured to generate a second adjustment voltage, wherein: each device in the first and second sets of semiconductor devices has a temperature-dependent junction; the first and second adjustment voltages are based on an ambient temperature affecting the temperature-dependent junction of each device in the first and second sets of semiconductor devices, respectively; a differential adjustment voltage based on a difference between the first and second adjustment voltages is applied to the first and second terminals to adjust a capacitance of the at least one varactor; and voltage changes due to changes in the ambient temperature affecting the temperature-dependent junctions in the first and second sets of semiconductor devices are added in the differential adjustment voltage.

According to certain aspects, no amplifier is connected between the sets of semiconductor devices and the at least one varactor. In other words, the first and second sets of semiconductor devices are connected with the first and second terminals, respectively, of the at least one varactor without an amplifier connected therebetween. For certain aspects, the first and second sets of semiconductor devices are connected with the first and second terminals, respectively, of the at least one varactor without a filter connected therebetween.

According to certain aspects, each set of semiconductor devices includes one or more diodes connected in series. For other aspects, each set of semiconductor devices includes one or more diode-connected transistors. For example, the diode-connected transistors may include diode-connected n-channel metal-oxide-semiconductor (NMOS) transistors or diode-connected bipolar junction transistors (BJTs) (also referred to as "BJT diodes").

According to certain aspects, each device in the first and second sets of semiconductor devices has a negative temperature coefficient.

According to certain aspects, the adjustment circuit further includes one or more scaling circuits connected between the first and second sets of semiconductor devices and the first and second terminals, respectively. For certain aspects, the scaling circuits are configured to scale a magnitude of the differential adjustment voltage, wherein the scaled differential adjustment voltage is applied to the first and second terminals.

According to certain aspects, the at least one varactor includes a first varactor connected in series with a second varactor. In this case, the first and second sets of semiconductor devices may be configured to apply the differential adjustment voltage across the first varactor and across the second varactor. An anode of the first varactor may be connected with an anode of the second varactor. For certain aspects, the adjustment circuit further includes a first impedance connected with a cathode of the first varactor and a second impedance connected with a cathode of the second varactor, wherein the adjustment circuit is configured to apply the differential adjustment voltage from the anode of the first varactor to the first impedance and from the anode of the second varactor to the second impedance.

According to certain aspects, the capacitance of the at least one varactor is inversely proportional to the square root of the differential adjustment voltage applied to the first and second terminals.

According to certain aspects, the adjustment circuit further includes a bias voltage source configured to bias the first and second sets of semiconductor devices. For certain aspects, the adjustment circuit also includes a first impedance connected between the bias voltage source and the first set of semiconductor devices, wherein the first set of semiconductor devices is connected with a reference potential for the bias voltage source; and a second impedance connected between the second set of semiconductor devices and the reference potential, wherein the second set of semiconductor devices is connected with the bias voltage source.

According to certain aspects, the adjustment circuit further includes one or more fixed capacitors in series with the at least one varactor.

According to certain aspects, each set of semiconductor devices includes one or more diodes connected in series, and each diode has a negative temperature coefficient. In this case, the first and second sets of semiconductor devices may be configured such that the voltage changes due to the negative temperature coefficients of the one or more diodes in the first and second sets of semiconductor devices are added in the differential adjustment voltage.

According to certain aspects, the adjustment circuit further includes one or more level shifting circuits connected between the first and second sets of semiconductor devices and the first and second terminals, respectively. For certain aspects, the one or more level shifting circuits are configured to level shift the differential adjustment voltage, wherein the level-shifted differential adjustment voltage is applied to the first and second terminals.

Certain aspects of the present disclosure provide a method for temperature-dependent adjustment of a resonant circuit. The method generally includes generating a differential adjustment voltage based on an ambient temperature of two sets of semiconductor devices, wherein each device in the sets of semiconductor devices has a temperature-dependent junction and wherein the two sets of semiconductor devices are configured such that effects of the temperature-dependent junctions from the two sets of semiconductor devices are combined in the differential adjustment voltage; and adjusting a capacitance of at least one varactor disposed in a signal path connected in parallel with the resonant circuit by applying the differential adjustment voltage across the at least one varactor.

Certain aspects of the present disclosure provide an apparatus for temperature-dependent adjustment of a resonant circuit. The apparatus generally includes means for generating a differential adjustment voltage based on an ambient temperature of two sets of semiconductor devices, wherein each device in the sets of semiconductor devices has a temperature-dependent junction and wherein the two sets of semiconductor devices are configured such that effects of the temperature-dependent junctions from the two sets of semiconductor devices are combined in the differential adjustment voltage; and means for adjusting a capacitance of at least one varactor disposed in a signal path connected in parallel with the resonant circuit by applying the differential adjustment voltage across the at least one varactor.

Certain aspects of the present disclosure provide an adjustment circuit for temperature-dependent adjustment of a resonant circuit. The adjustment circuit generally includes at least one varactor having a first terminal and a second terminal; a biasing circuit connected with the first terminal and configured to generate a bias voltage for applying to the first terminal; and a set of one or more semiconductor devices connected with the second terminal and configured to generate an adjustment voltage for applying to the second terminal based on an ambient temperature of the one or more semiconductor devices to adjust a capacitance of the at least one varactor, wherein each device in the set of semiconductor devices has a temperature-dependent junction.

According to certain aspects, the set of semiconductor devices is connected with the second terminal without an amplifier connected therebetween. For certain aspects, the set of semiconductor devices is connected with the second terminal without a filter connected therebetween.

According to certain aspects, the set of semiconductor devices includes one or more diodes connected in series. For other aspects, the set of semiconductor devices includes one or more diode-connected transistors, which may be diode-connected NMOS transistors or BJTs, for example.

According to certain aspects, each device in the set of semiconductor devices has a negative temperature coefficient.

According to certain aspects, the adjustment circuit further includes a scaling circuit connected between the set of semiconductor devices and the second terminal. For certain aspects, the scaling circuit is configured to scale a magnitude of the adjustment voltage, wherein the scaled adjustment voltage is applied to the second terminal.

According to certain aspects, the at least one varactor includes a first varactor connected in series with a second varactor. For certain aspects, the set of semiconductor devices is configured to generate the adjustment voltage for applying to the second terminal of the first varactor and to the second terminal of the second varactor. For certain aspects, the biasing circuit is configured to generate the bias voltage for applying to the first terminal of the first varactor and to the first terminal of the second varactor. For certain aspects, the first terminal of the first varactor comprises an anode of the first varactor, the first terminal of the first varactor is connected with the first terminal of the second varactor, and the first terminal of the second varactor comprises an anode of the second varactor. For certain aspects, a first impedance is connected with the second terminal of the first varactor, the second terminal of the first varactor comprises a cathode of the first varactor, and a second impedance is connected with the second terminal of the second varactor. For certain aspects, the second terminal of the second varactor comprises a cathode of the second varactor. The set of semiconductor devices is configured to apply the adjustment voltage to the first impedance and to the second impedance for certain aspects.

According to certain aspects, the capacitance of the at least one varactor is inversely proportional to the square root of the voltage difference between the bias voltage and the adjustment voltage applied across the at least one varactor.

According to certain aspects, the adjustment circuit further includes a bias voltage source configured to bias at least one of the biasing circuit or the set of semiconductor devices.

According to certain aspects, the biasing circuit includes a first impedance connected between the bias voltage source and the first terminal and a second impedance connected between the first terminal and a reference potential for the bias voltage source. At least one of the first impedance or the second impedance is adjustable for certain aspects. For certain aspects, the adjustment circuit further includes a third impedance connected between the bias voltage source and the set of semiconductor devices. In this case, the set of semiconductor devices may be connected with the reference potential for the bias voltage source.

According to certain aspects, the adjustment circuit further includes one or more fixed capacitors in series with the at least one varactor.

According to certain aspects, the adjustment circuit further includes a level shifting circuit connected between the set of semiconductor devices and the second terminal. For certain aspects, the level shifting circuit is configured to level shift the adjustment voltage, wherein the level-shifted adjustment voltage is applied to the second terminal.

Certain aspects of the present disclosure provide a method for temperature-dependent adjustment of a resonant circuit. The method generally includes generating a bias voltage; generating an adjustment voltage based on an ambient temperature of a set of one or more semiconductor devices, wherein each device in the set of semiconductor devices has a temperature-dependent junction; and adjusting a capacitance of at least one varactor disposed in a signal path connected in parallel with the resonant circuit by applying a voltage difference, based on the bias voltage and the adjustment voltage, across the at least one varactor.

Certain aspects of the present disclosure provide an apparatus for temperature-dependent adjustment of a resonant circuit. The apparatus generally includes means for generating a bias voltage; means for generating an adjustment voltage based on an ambient temperature of a set of one or more semiconductor devices, wherein each device in the set of semiconductor devices has a temperature-dependent junction; and means for adjusting a capacitance of at least one varactor disposed in a signal path connected in parallel with the resonant circuit by applying a voltage difference, based on the bias voltage and the adjustment voltage, across the at least one varactor.

Certain aspects of the present disclosure provide a voltage-controlled oscillator that generally includes a resonant circuit, an active negative transconductance and biasing circuit connected with the resonant circuit, and any of the adjustment circuits described herein connected with the resonant circuit.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
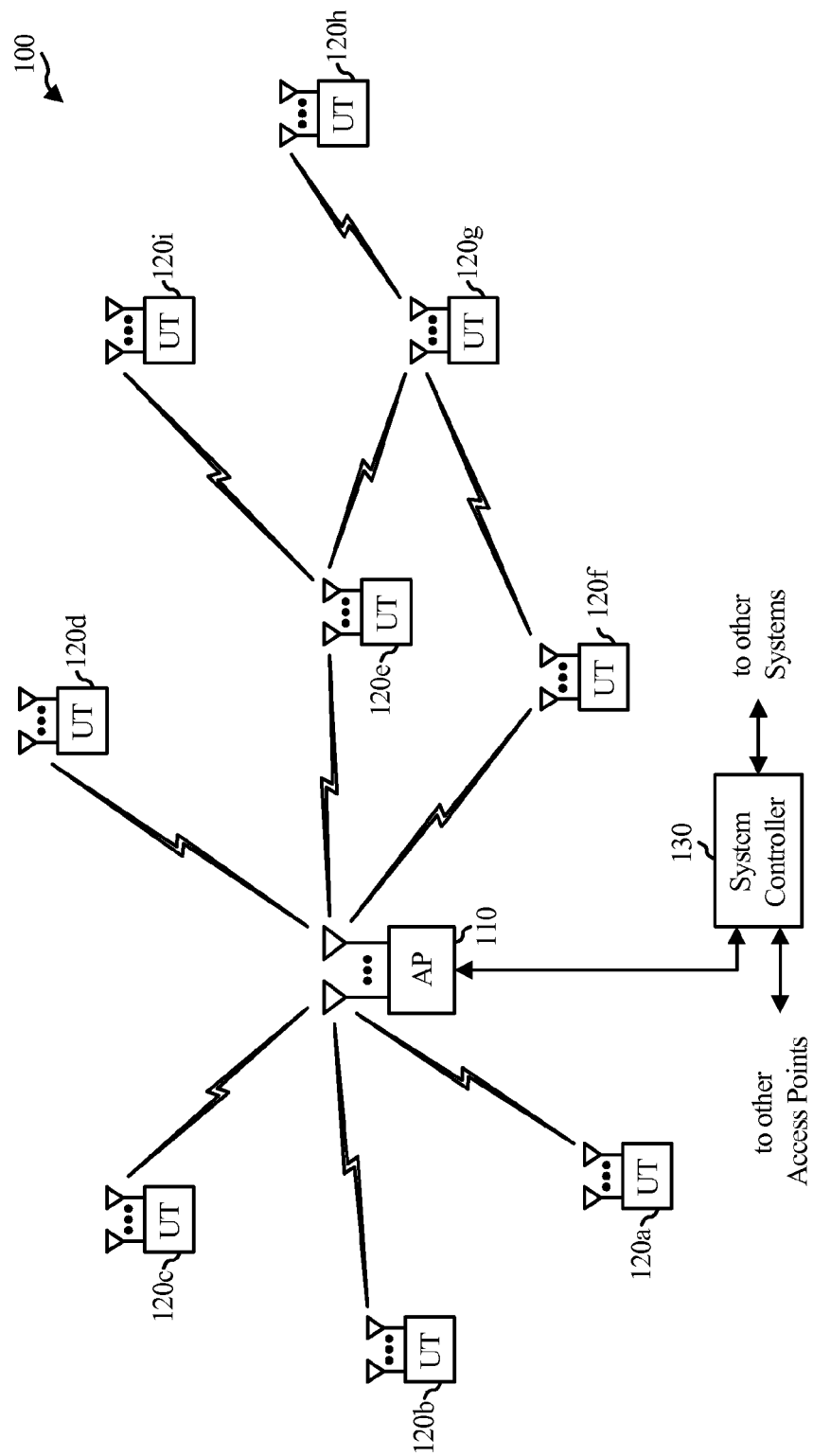
FIG. 1 is a diagram of an example wireless communications network, in accordance with certain aspects of the present disclosure.

Certain aspects of the present disclosure generally relate to temperature-dependent adjustment of a resonant circuit (also known as a tank circuit, inductor-capacitor (LC) circuit, or tuned circuit), such as that found in a voltage-controlled oscillator (VCO). According to certain aspects, two sets of semiconductor devices having temperature-dependent junctions (e.g., diodes or diode-connected transistors) connected in a differential configuration are added to the VCO circuitry in order to generate a differential DC voltage across at least one varactor connected with the VCO's resonant circuit. As temperature rises, the forward voltage drop across each semiconductor device may decrease with a particular temperature coefficient. This DC voltage change applied to the at least one varactor may change an effective capacitance of the resonant circuit such that the VCO frequency drift with temperature may be efficiently compensated (or at least reduced).

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method, which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art. The techniques described herein may also be implemented in any of various other suitable wireless systems using radio frequency (RF) technology, including Global Navigation Satellite System (GNSS), Bluetooth, IEEE 802.15 (Wireless Personal Area Network (WPAN)), Near Field Communication (NFC), Small Cell, Frequency Modulation (FM), and the like.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different technologies, system configurations, networks, and protocols, some of which are illustrated by way of example in the figures and in the following description of certain aspects. The detailed description and drawings are merely illustrative of the disclosure rather than limiting.

An Example Wireless System

FIG. 1 illustrates a wireless communications system 100 with access points 110 and user terminals 120, either of which may include or utilize aspects of the present disclosure. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

The access point 110 and/or user terminal 120 may include one or more frequency synthesizers to generate oscillating signals used for signal transmission and/or reception. Each frequency synthesizer may comprise one or more voltage-controlled oscillators (VCOs) configured to generate oscillating signals at particular frequencies. In an effort to compensate (or at least reduce) the frequency drift of a VCO with temperature, the VCOs may include temperature-dependent adjustment circuits, in accordance with certain aspects of the present disclosure.

Figure 2:
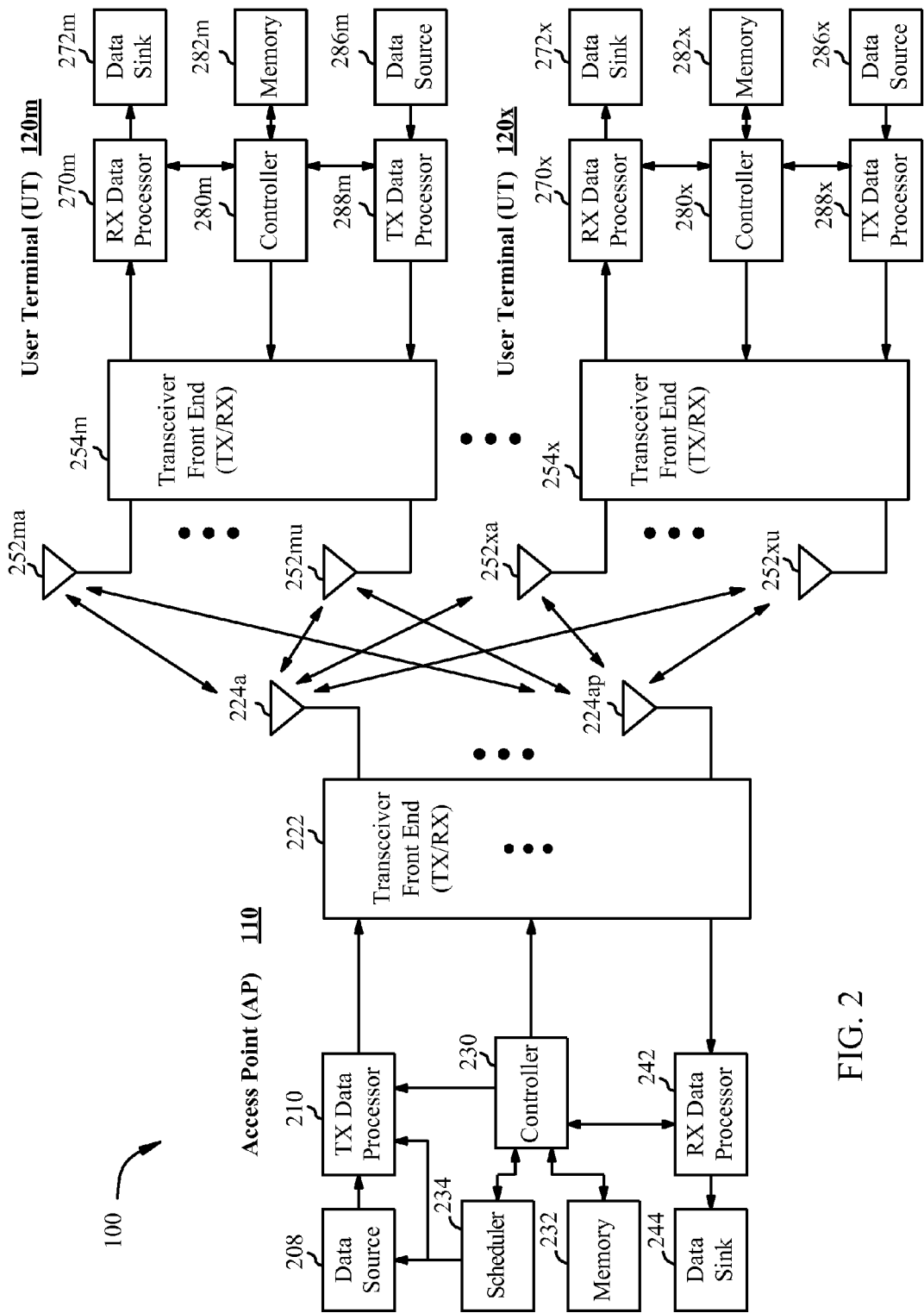
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front-end (TX/RX) 254 (also known as a radio frequency front-end (RFFE)) receives and processes (e.g., converts to analog, amplifies, filters, and frequency upconverts) a respective symbol stream to generate an uplink signal. The transceiver front-end 254 may also route the uplink signal to one of the $N_{ut,m}$ antennas for transmit diversity via an RF switch, for example. The controller 280 may control the routing within the transceiver front-end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front-end 222 may select signals received from one of the antennas 224 for processing. For certain aspects of the present disclosure, a combination of the signals received from multiple antennas 224 may be combined for enhanced receive diversity. The access point's transceiver front-end 222 also performs processing complementary to that performed by the user terminal's transceiver front-end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal TX data processor 210 may provide a downlink data symbol streams for one of more of the $N_{dn}$ user terminals to be transmitted from one of the $N_{ap}$ antennas. The transceiver front-end 222 receives and processes (e.g., converts to analog, amplifies, filters, and frequency upconverts) the symbol stream to generate a downlink signal. The transceiver front-end 222 may also route the downlink signal to one or more of the $N_{ap}$ antennas 224 for transmit diversity via an RF switch, for example. The controller 230 may control the routing within the transceiver front-end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front-end 254 may select signals received from one of the antennas 252 for processing. For certain aspects of the present disclosure, a combination of the signals received from multiple antennas 252 may be combined for enhanced receive diversity. The user terminal's transceiver front-end 254 also performs processing complementary to that performed by the access point's transceiver front-end 222 and provides a recovered downlink data symbol stream. An RX data processor 270 processes (e.g., demodulates, deinterleaves, and decodes) the recovered downlink data symbol stream to obtain decoded data for the user terminal.

The transceiver front-end 222 of access point 110 and/or transceiver front-end 254 of user terminal 120 may include one or more frequency synthesizers to generate oscillating signals used for signal transmission and/or reception. Each frequency synthesizer may comprise one or more VCOs configured to generate oscillating signals at particular frequencies. In an effort to compensate (or at least reduce) the frequency drift of a VCO with temperature, the VCOs may include temperature-dependent adjustment circuits, in accordance with certain aspects of the present disclosure.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
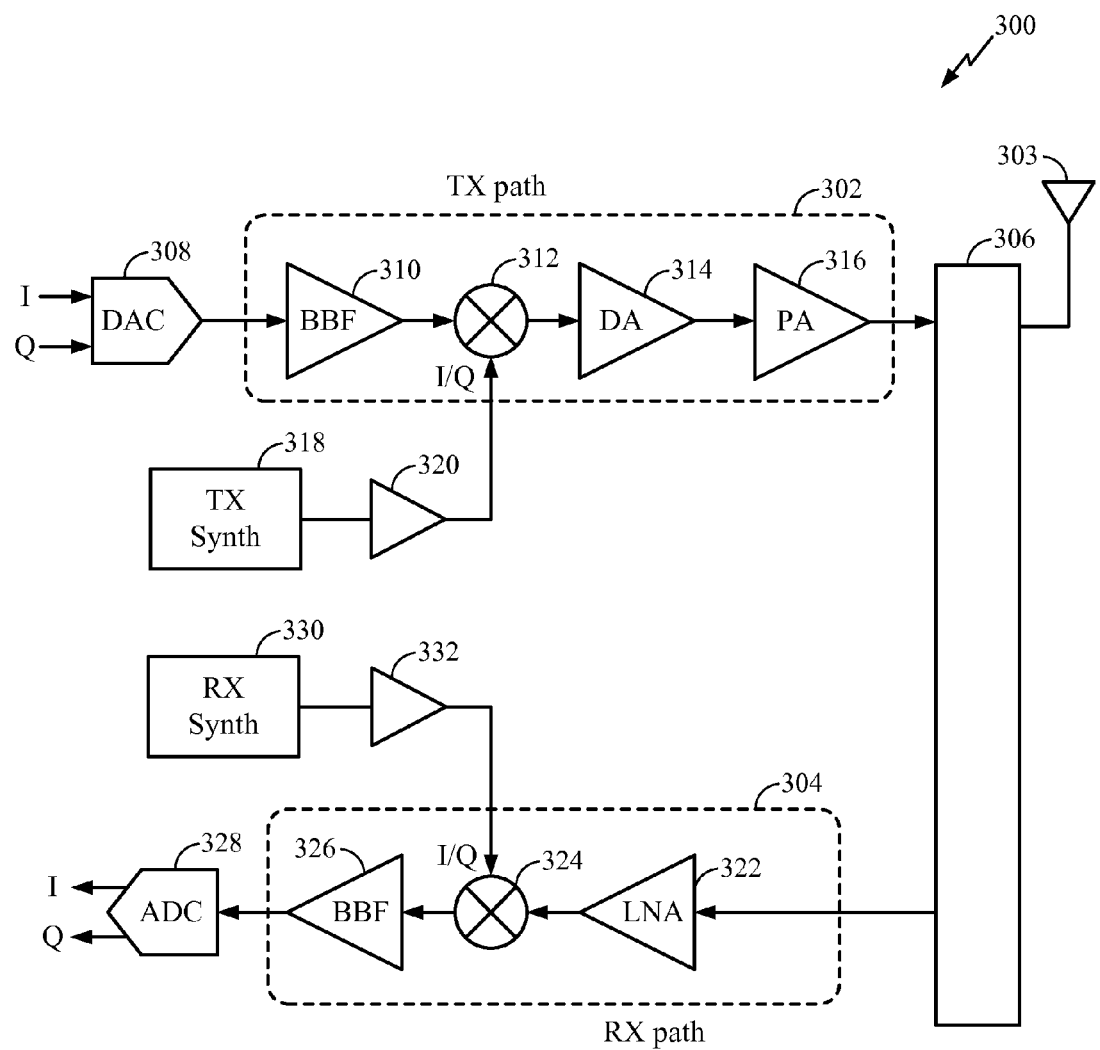
FIG. 3 is a block diagram of an example transceiver front-end, in accordance with certain aspects of the present disclosure.

FIG. 3 is a block diagram of an example transceiver front-end 300, such as transceiver front-ends 222, 254 in FIG. 2, in which aspects of the present disclosure may be practiced. Also referred to as a radio frequency front-end (RFFE), the transceiver front-end 300 includes at least one transmit (TX) path 302 (also known as a transmit chain) for transmitting signals via one or more antennas 303 and at least one receive (RX) path 304 (also known as a receive chain) for receiving signals via the antennas. When a TX path 302 and an RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO in each TX path is typically produced by a TX frequency synthesizer 318 and may be buffered or amplified by amplifier 320 before being mixed with the baseband signals in the mixer 312. Similarly, the receive LO in each RX path is typically produced by an RX frequency synthesizer 330 and may be buffered or amplified by amplifier 332 before being mixed with the RF signals in the mixer 324. In some aspects of the present disclosure, the VCO of the frequency synthesizer may be implemented as a part of a phase-locked loop (PLL) circuit.

As described above, the TX frequency synthesizer 318 and/or RX frequency synthesizer 330 may include one or more VCOs configured to generate oscillating signals at particular frequencies. In an effort to compensate (or at least reduce) the frequency drift of a VCO with temperature, the VCOs may include temperature-dependent adjustment circuits, in accordance with certain aspects of the present disclosure.

Example Resonant Circuit Temperature Compensation

Figure 8:
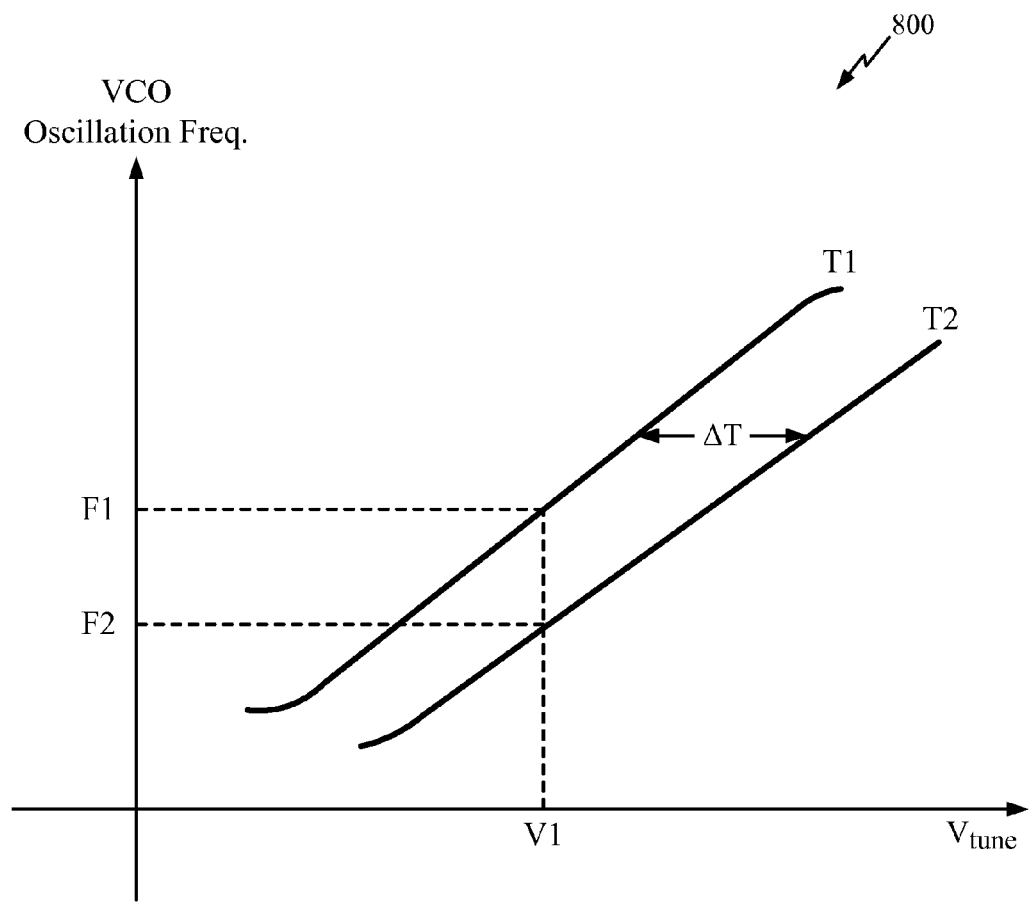
FIG. 8 is a graph illustrating an example temperature-dependent change in an example relationship between VCO oscillation frequency and VCO tuning voltage, in accordance with certain aspects of the present disclosure.

In designing VCO circuits, frequency drift due to temperature changes (i.e., thermal drift) is an undesirable characteristic of the VCO. FIG. 8 is a graph 800 illustrating an example relationship between the VCO oscillation frequency ($f_{VCO}$) as a function of the VCO tuning voltage ($V_{tune}$), in accordance with certain aspects of the present disclosure. For a given control voltage $V_{tune}$=V1 and VCO temperature T1, the VCO oscillation frequency is shown to be F1 in the graph 800. However, a change ΔT in VCO temperature from T1 to T2 causes the VCO oscillation frequency to shift from F1 to F2, which is a lower frequency. If T2 is greater than T1, then the VCO oscillation frequency change is inversely proportional to the temperature shift (i.e., as the temperature increases, $f_{VCO}$ decreases and vice versa). The shift in frequency may be caused by temperature-dependent changes in the resonant circuit (e.g., the capacitance of the capacitor bank or the varactor).

The temperature shift may be due to changes in ambient temperature for a device with the VCO or heat generation in other circuitry near the VCO. For example, in WLAN applications, power amplification circuitry (e.g., DA 314 and/or PA 316) may be turned on for a prolonged period during transmission of data packets. Since the power amplification circuitry carries a large amount of current, this circuitry may generate heat, which may cause an ambient temperature affecting nearby circuitry (e.g., the VCO in the RF front-end) to increase. An excessive amount of heat (e.g., an ambient temperature increased above a threshold) may cause the frequency of an oscillating signal generated by the VCO to shift abruptly. If the VCO's tuning input ($V_{tune}$) does not have a sufficient voltage range, then the temperature increase may subsequently cause a PLL controlling the VCO to lose lock.

Conventional hardware designs that implement temperature compensation circuitry to address the issue of VCO frequency drift typically occupy relatively large layout areas. For example, one conventional hardware design provides, to a VCO, a temperature-compensated voltage generated from a proportional-to-absolute-temperature (PTAT) current from a bandgap circuit. Since the voltage generated by the bandgap circuit has a relatively low temperature coefficient, substantial amplification may be applied for adequate temperature compensation. As a result of this amplification, a high amount of noise may be generated by the amplifier. In order to suppress this noise, a very low frequency filter may be utilized, which leads to an excessively large layout area.

Accordingly, what is needed are techniques and apparatus for temperature compensation of a VCO that involve less real estate than the traditional amplifier and filter designs, preferably with low noise.

Figure 4:
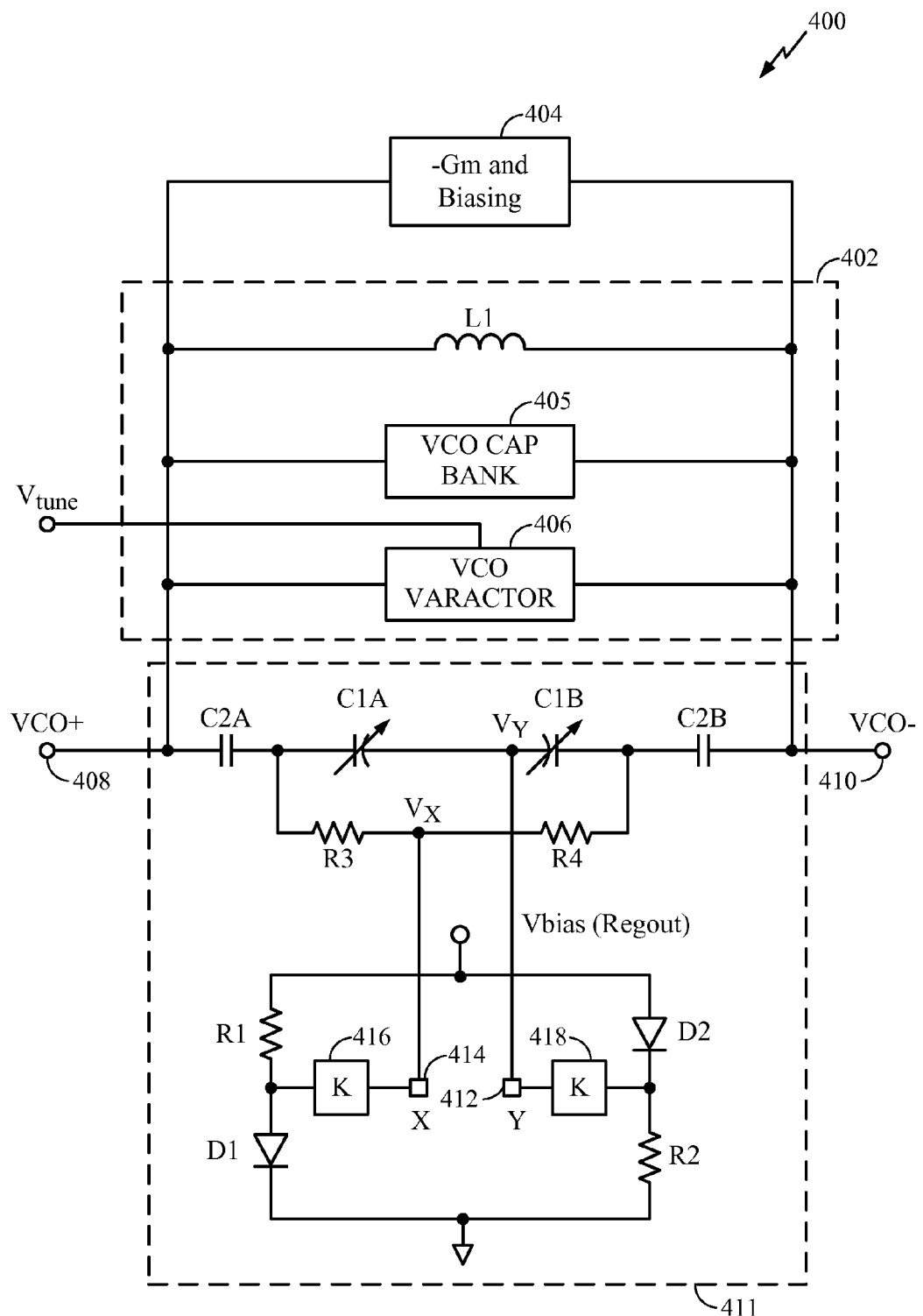
FIG. 4 is a schematic diagram of an example voltage-controlled oscillator (VCO) with a temperature-dependent adjustment circuit implemented with a pair of diodes connected in a differential configuration, in accordance with certain aspects of the present disclosure.

Example Double-Sided Configuration for Resonant Circuit Temperature Compensation FIG. 4 illustrates an example VCO 400 with a temperature-dependent adjustment circuit 411, in accordance with certain aspects of the present disclosure. The VCO 400 also includes a resonant circuit 402 and an active negative transconductance (−Gm) and biasing circuit 404 connected with the resonant circuit 402. Cross-coupled transistors (NMOS, PMOS, or CMOS configuration) may be used to generate the active negative transconductance portion of circuit 404, which serves to cancel out the loss (due to parasitics) of the resonant circuit 402 and, thus, to sustain the oscillation mechanism in the VCO 400. The biasing portion of circuit 404 may include a bias current circuit configured to source or sink a bias current through the resonant circuit 402 and the active negative transconductance portion to generate a differential oscillating signal output by the VCO 400 at terminals VCO+ 408 and VCO− 410. For certain aspects, the resonant circuit 402 includes an inductive element L1 (e.g., an inductor) connected in parallel with a variable capacitive element, where adjusting the capacitance of the capacitive element changes the resonant frequency. The capacitive element may be implemented with a capacitor bank 405 connected in parallel with a varactor 406, where the capacitance of the varactor 406 is adjusted by the VCO tuning voltage ($V_{tune}$), which may be output by a charge pump and associated low-pass filter of tune, a phase-locked loop (PLL) for certain aspects.

As described above, however, the resonant frequency of the resonant circuit 402 is susceptible to changes in temperature. In an effort to compensate for, or at least reduce the effects of, the temperature changes, a temperature-dependent adjustment circuit 411 implemented with a pair of diodes D1, D2 connected in a differential configuration may be added to the VCO 400. The temperature-dependent adjustment circuit 411 may include a variable capacitive element, which may be connected in parallel with the variable capacitive element in the resonant circuit 402 (e.g., in parallel with the varactor 406). By changing the capacitance of the variable capacitive element in the adjustment circuit 411, the effective capacitance of the resonant circuit 402—and hence the resonant frequency of the VCO's oscillating signal—changes accordingly. The variable capacitive element in the adjustment circuit 411 may be implemented with one or more varactors C1A, C1B. For certain aspects, the varactors C1A, C1B may be connected in series with one or more fixed capacitors C2A, C2B, as shown in FIG. 4.

To automatically control the variable capacitive element in the adjustment circuit 411 according to changes in temperature, a differential adjustment voltage may be applied across the varactors C1A, C1B. This differential adjustment voltage is temperature dependent and may be generated in any suitable manner, example of which are described below.

In FIG. 4, for example, the temperature-dependent adjustment circuit 411 is implemented with a pair of diodes D1, D2 connected in a differential configuration to generate the differential adjustment voltage. A diode has a known temperature coefficient that depends on the type of semiconductor (e.g., Si) used to form the diode's p-n junction. For example, silicon (Si) diodes have a fairly linear temperature coefficient of approximately −1.8 mV/° C., meaning that the forward voltage ($V_F$) of a Si diode drops 1.8 mV for every 1° C. increase in temperature. By connecting the diodes D1, D2 in a differential configuration as shown in FIG. 4, this temperature coefficient is effectively doubled (e.g., to −3.6 mV/° C. for Si diodes), as explained in greater detail below.

Diodes D1 and D2 may be forward biased in any suitable manner. For certain aspects, as shown in FIG. 4, a bias voltage source outputting a bias voltage (Vbias) forward biases diode D1 via resistor R1, where the cathode of diode D1 is connected with a reference potential for the bias voltage source, such as electrical ground or a common-mode voltage of the VCO 400. For certain aspects, the bias voltage source also forward biases diode D2, where the anode of diode D2 is connected with the bias voltage and the cathode of diode D2 is connected with a resistor R2.

Assuming that optional circuits 416, 418 are not present and effectively shorted, the forward voltage across diode D1 ($V_{F1}$) is equal to Vx at node 414, and the voltage at node 412 (Vy) is equal to the difference between the bias voltage and forward voltage across diode D2 ($V_{F2}$). Therefore, the difference between the voltages at nodes 412 and 414 (Vy−Vx) is equal to Vbias−$V_{F2}$−$V_{F1}$, which equals Vbias−$2V_F$ if diodes D1 and D2 are the same semiconductor material. If Vbias is constant with changes in temperature, then one can see how the pair of diodes D1, D2 connected in the differential configuration have an effectively doubled temperature coefficient. The voltage difference Vy−Vx is basically the differential adjustment voltage applied across the varactors C1A, C1B.

Because the forward voltage of the diodes has a negative temperature coefficient, as temperature increases, the forward voltage of the diodes decreases, and the voltage difference Vy−Vx=Vbias−$2V_F$ increases. As voltage difference Vy−Vx increases, the capacitance of the varactors C1A, C1B decreases (e.g., the varactor capacitance may be inversely proportional to the square root of the differential adjustment voltage applied across the varactor), which decreases the effective capacitance of the resonant circuit 402 (e.g., capacitances add for capacitors in parallel), thereby increasing the VCO oscillation frequency. This increase in VCO oscillation frequency counteracts the decrease in VCO oscillation frequency with increased temperature shown in the graph 800 of FIG. 8 in a VCO without the temperature-dependent adjustment circuit 411.

For certain aspects, node 414 is connected with an impedance (e.g., resistor R3) that is connected with one terminal of varactor C1A and with another impedance (e.g., resistor R4) that is connected with one terminal of varactor C1B. Node 412 is connected with the other terminal of varactor C1A and the other terminal of varactor C1B.

By connecting the diodes D1, D2 in a differential configuration as shown in FIG. 4, the effective temperature coefficient of the differential adjustment voltage is twice that of a single diode (e.g., −3.6 mV/° C. for Si diodes). This temperature coefficient is substantially greater than that of PTAT voltage generated by the bandgap circuit, which may be only +0.15 mV/° C. Furthermore, the temperature-dependent adjustment circuit 411 need not include an amplifier (e.g., an operational amplifier) and, therefore, has low noise, thereby avoiding the inclusion of a large, low-pass filter.

For certain aspects, the temperature adjustment magnitude (e.g., the degree to which the voltage across the diodes D1, D2 affects the variable capacitive element in the temperature-dependent circuit 411) can be scaled by changing the values of varactors C1A, C1B. For certain aspects, varactors C1A, C1B may be programmable. Additionally or alternatively, optional circuits 416, 418 may be implemented as scaling circuits to amplify (by scaling factor K) the voltage at the anode of diode D1 and/or the voltage at the cathode of diode D2. The scaling circuits may be implemented with transistors configured as common gate or common source amplifiers, for example.

According to certain aspects, the pair of diodes D1, D2 in FIG. 4 may be replaced with diode-connected bipolar junction transistors (BJTs) (also referred to as "BJT diodes"). These BJT diodes typically have similar p-n junctions with similar negative temperature coefficients as the diodes D1, D2.

Figure 5:
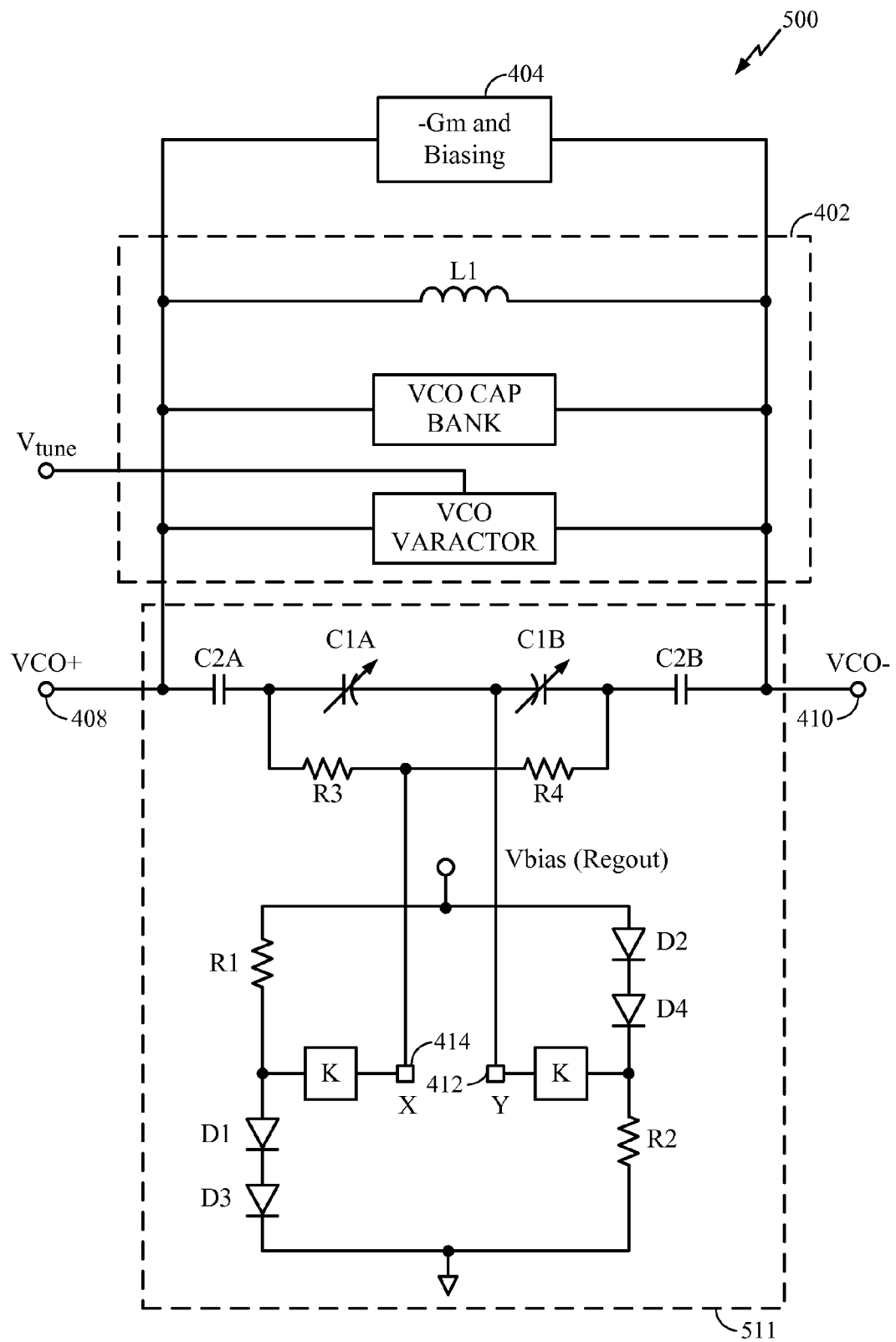
FIG. 5 is a schematic diagram of an example VCO with a temperature-dependent adjustment circuit implemented with a stack of diodes replacing each of the diodes in FIG. 4, in accordance with certain aspects of the present disclosure.

FIG. 5 illustrates another example VCO 500 with a temperature-dependent adjustment circuit 511, in accordance with certain aspects of the present disclosure. In this aspect, a stack of N diodes (N>1) replaces each of the diodes D1, D2 in the temperature-dependent adjustment circuit 411 of FIG. 4. As illustrated in the example adjustment circuit 511, N=2, such that diodes D1 and D3 are connected in series and replace diode D1 in FIG. 4 and diodes D2 and D4 are connected in series in FIG. 5 and replace diode D2 in FIG. 4. By stacking the diodes in this manner, the temperature sensitivity of the temperature-dependent adjustment circuit 511 can be increased compared to the adjustment circuit 411 in FIG. 4. For example, with N=2 as shown in FIG. 5, the combined temperature coefficient of diodes D1-D4 connected in the differential configuration may be approximately −7.2 mV/° C.). The increased temperature sensitivity may be used in cases where the capacitance of the resonant circuit 402 is more temperature sensitive than the pair of diodes D1 and D2 in the differential configuration can compensate for (or at least adjust). The number of series-connected diodes may be increased as long as there is enough voltage headroom in the VCO 500 to support the added forward voltage drop of the stacked diodes.

For certain aspects, optional circuits 416, 418 may be implemented as level shifting circuits to level shift the DC voltage at the anode of diode D1 to another DC voltage at node 414 and/or the DC voltage at the cathode of diode D2 to another DC voltage at node 412. The level shifting circuits may be implemented with source followers or voltage dividers, for example. For certain aspects, the optional circuits 416, 418 may include scaling circuits in addition to or as an alternative to the level shifting circuits.

Figure 6:
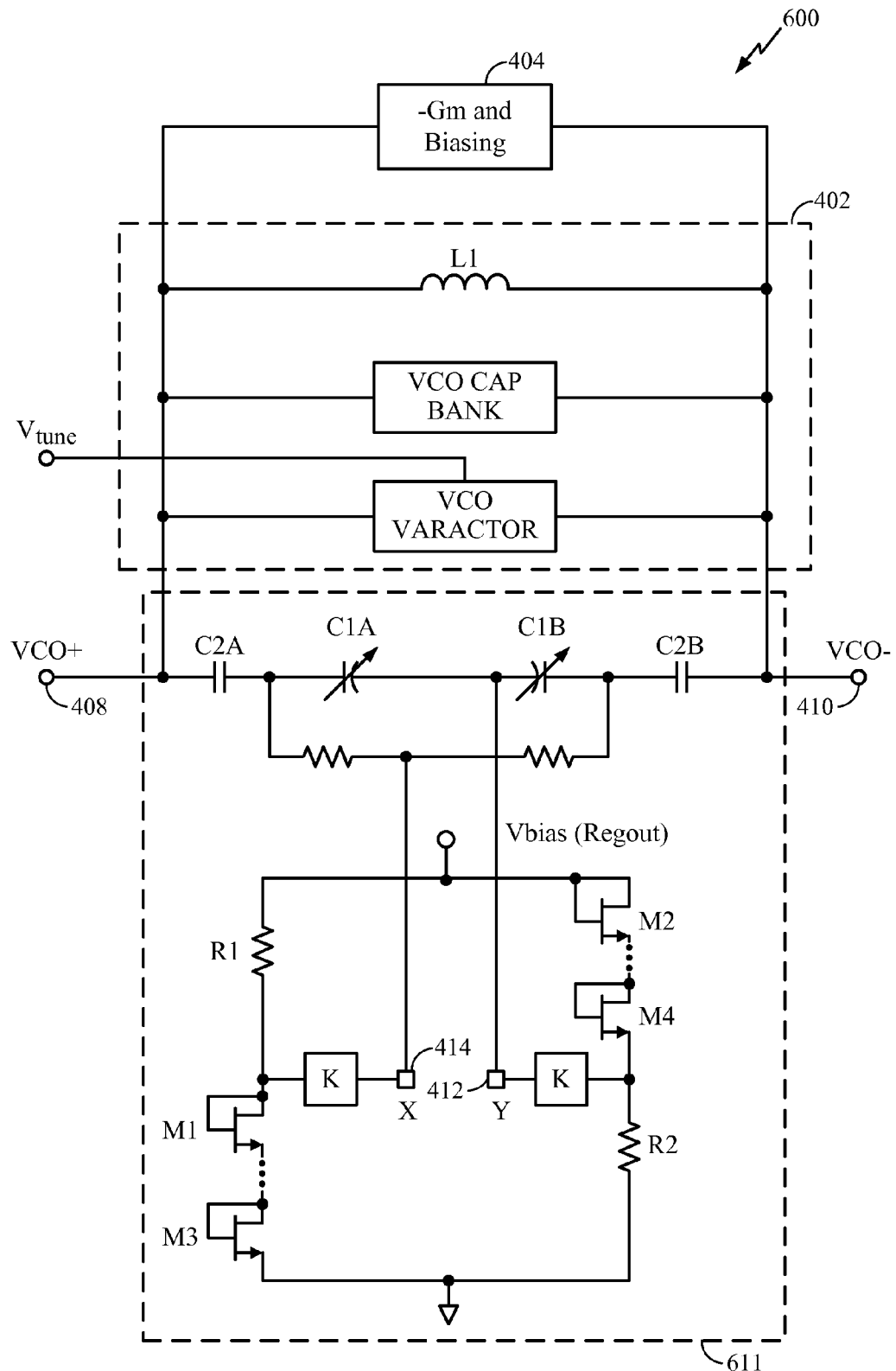
FIG. 6 is a schematic diagram of an example VCO with a temperature-dependent adjustment circuit implemented with a stack of n-channel metal-oxide-semiconductor (NMOS) diode-connected transistors replacing each of the diodes in FIG. 4, in accordance with certain aspects of the present disclosure.

FIG. 6 illustrates another example VCO 600 with a temperature-dependent adjustment circuit 611, in accordance with certain aspects of the present disclosure. In this aspect, a set of one or more diode-connected transistors replaces each of the diodes D1, D2 in the temperature-dependent adjustment circuit 411 of FIG. 4. Native n-channel metal-oxide-semiconductor (NMOS) transistors have almost zero threshold voltage ($V_{Th}$) and, therefore, can be stacked in a string of N devices to increase the temperature sensitivity, without the voltage headroom limitation of the stacked diodes above. As illustrated in the example adjustment circuit 611, N=2, such that diode-connected NMOS transistors M1 and M3 are stacked and replace diode D1 in FIG. 4 and diode-connected NMOS transistors M2 and M4 are stacked in FIG. 6 and replace diode D2 in FIG. 4.

Figure 7:
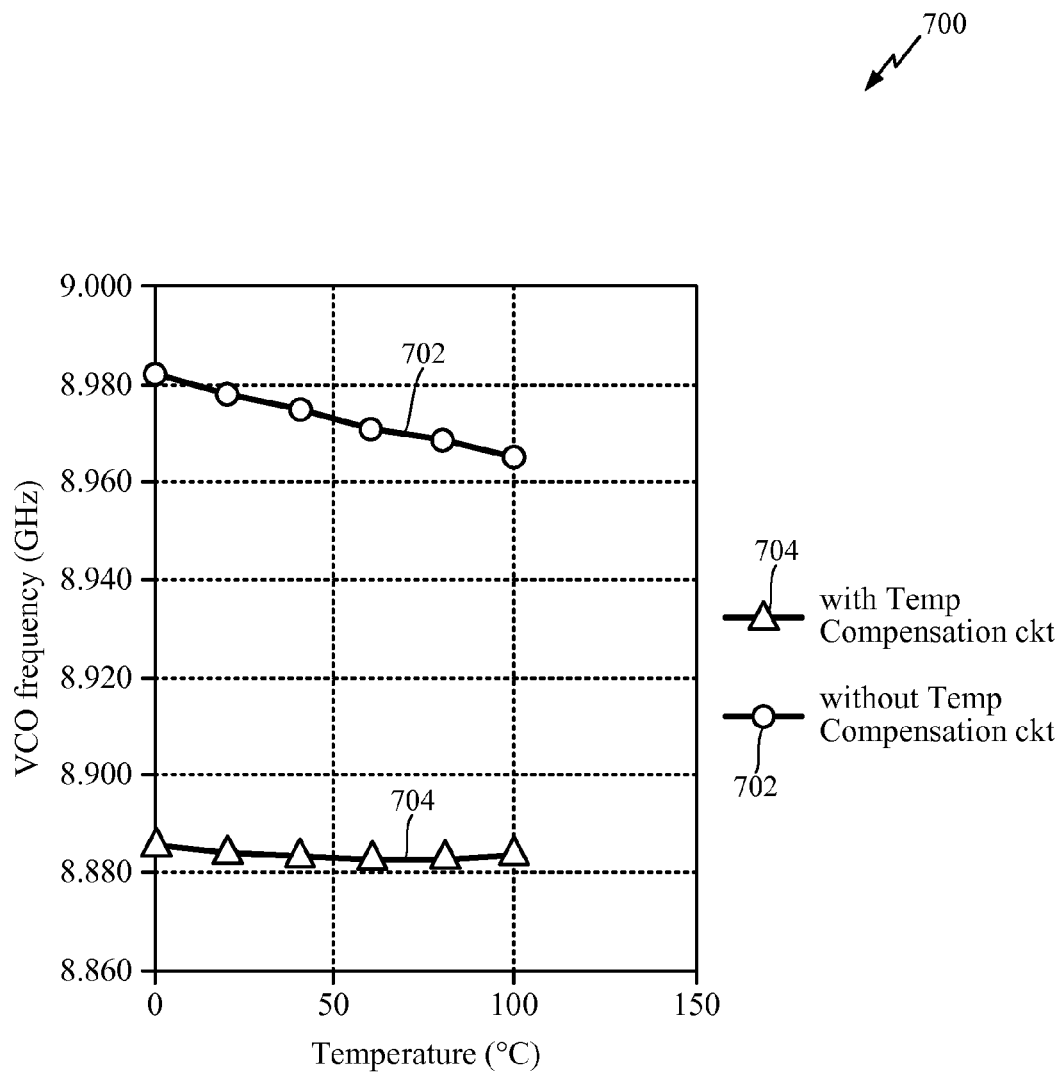
FIG. 7 is an example graph illustrating VCO frequency as a function of temperature in a VCO both with and without a temperature compensation circuit, in accordance with certain aspects of the present disclosure.

FIG. 7 is an example graph 700 illustrating VCO frequency as a function of temperature in a VCO both with and without a temperature compensation circuit, in accordance with certain aspects of the present disclosure. The curve 702 shows the VCO frequency in GHz as a function of temperature in degrees Fahrenheit where the VCO has no temperature compensation circuit (or where the temperature compensation circuit has been deactivated). The curve 702 illustrates that a VCO frequency drift of nearly 20 MHz may occur as the temperature increases from 0 to 100° C. The curve 704 in FIG. 7 shows the VCO frequency as a function of temperature where the same VCO has a temperature compensation circuit (e.g., the temperature-dependent adjustment circuit 411 illustrated in FIG. 4). It can be observed that, in this case, the VCO frequency is much more stable in the temperature range of 0 to 100° C., shifting less than 5 MHz. Moreover, the temperature-dependent adjustment circuits presented in this disclosure (e.g., the temperature-dependent adjustment circuit 411 illustrated in FIG. 4) occupy substantially less area compared to conventional designs, such as those based on the PTAT current from a bandgap circuit.

Figure 9:
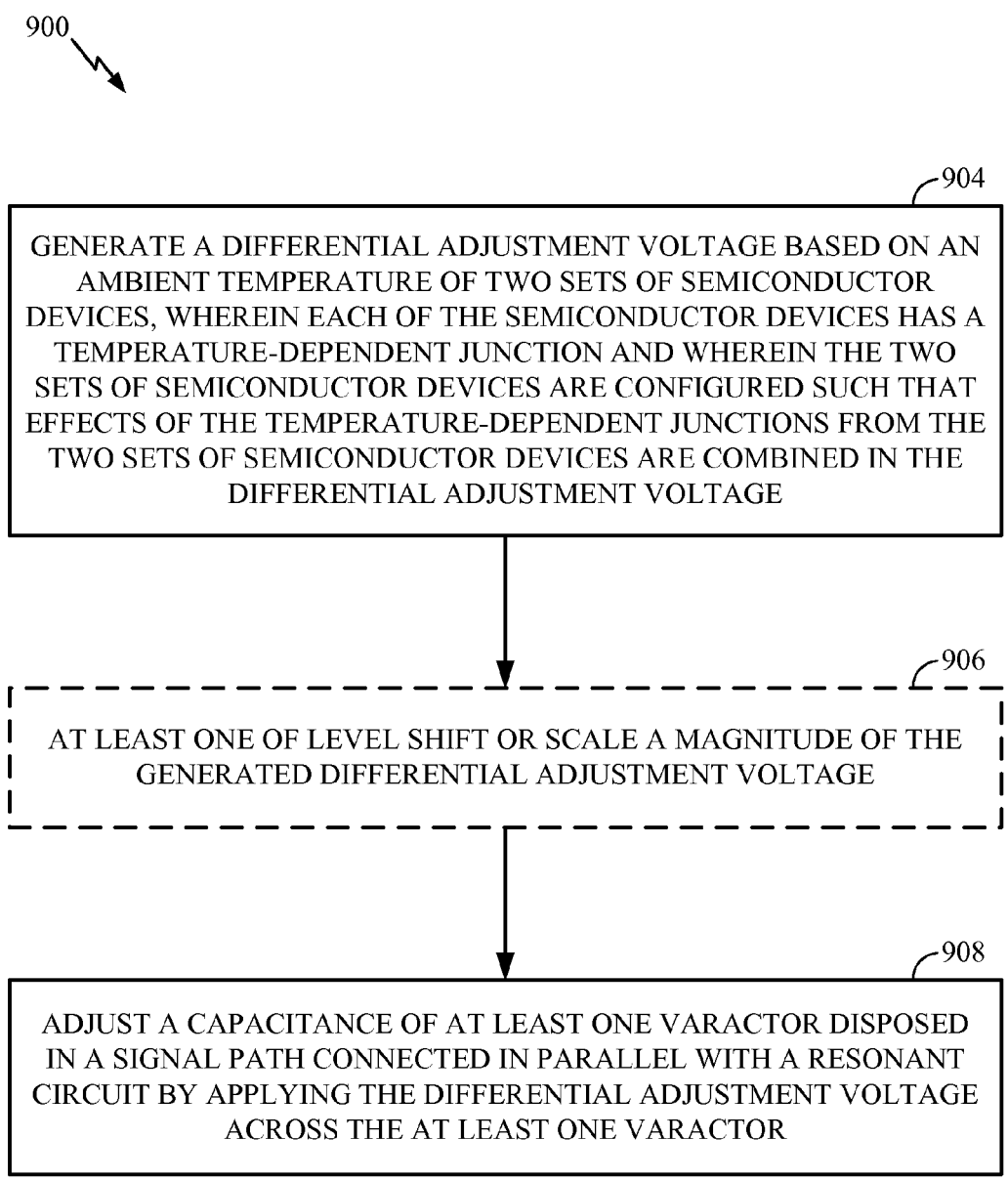
FIG. 9 is a flow diagram of example operations for temperature adjustment of a resonant circuit, in accordance with certain aspects of the present disclosure.

FIG. 9 is a flow diagram of example operations 900 for temperature-dependent adjustment of a resonant circuit, in accordance with certain aspects of the present disclosure. The operations 900 may be performed by an apparatus, such as a VCO having a resonant circuit and a temperature-dependent adjustment circuit (e.g., VCO 400 with resonant circuit 402 and adjustment circuit 411 illustrated in FIG. 4).

The operations 900 may begin, at block 904, with the apparatus generating a differential adjustment voltage based on an ambient temperature of two sets of semiconductor devices. Each of the semiconductor devices in the two sets has a temperature-dependent junction (e.g., with a negative temperature coefficient). The two sets of semiconductor devices may be configured such that effects of the temperature-dependent junctions from the two sets of semiconductor devices are combined (e.g., added) in the differential adjustment voltage. At block 908, the apparatus may adjust a capacitance of at least one varactor (e.g., varactors C1A, C1B) disposed in a signal path connected in parallel with the resonant circuit by applying the differential adjustment voltage across the at least one varactor. For certain aspects, the capacitance of the at least one varactor is inversely proportional to the square root of the differential adjustment voltage applied across the at least one varactor.

According to certain aspects, the operations 900 may further include the apparatus generating a periodic signal (e.g., an oscillating signal from a VCO) using the resonant circuit. This periodic signal may have a frequency with a negative temperature coefficient (i.e., frequency decreases with increased temperature). For certain aspects, adjusting the capacitance of the at least one varactor at block 908 reduces a magnitude of the negative temperature coefficient of the frequency. For certain aspects, as the ambient temperature of the two sets of semiconductor devices increases, junction voltages of the temperature-dependent junctions are configured to decrease, the differential adjustment voltage is configured to increases, and the capacitance of the at least one varactor is configured to decrease. In this case, as the ambient temperature of the two sets of semiconductor devices increases, an overall capacitance of the signal path connected in parallel with the resonant circuit may be configured to decrease, and the frequency of the periodic signal may be configured to increase, compared to the resonant circuit without the signal path at the ambient temperature.

According to certain aspects, the operations 900 may further involve the apparatus optionally at least one of level shifting or scaling a magnitude of the generated differential adjustment voltage at block 906 before applying the differential adjustment voltage across the at least one varactor at block 908.

According to certain aspects, the operations 900 further entail biasing the two sets of semiconductor devices using a bias voltage source.

According to certain aspects, each set of semiconductor devices comprises one or more diodes (e.g., diodes D1, D3) and/or one or more diode-connected transistors. The diode-connected transistors may be diode-connected NMOS transistors (e.g., transistors M2, M4) or diode-connected BJTs (also referred to as "BJT diodes"), for example.

Example Single-Sided Configuration for Resonant Circuit Temperature Compensation FIGS. 4-6 described above illustrate example VCOs implemented with semiconductor devices having temperature-dependent junctions in both branches (i.e., for both nodes 412 and 414) of the temperature-dependent adjustment circuits for a double-sided configuration. However, other aspects may have temperature-dependent adjustment circuits implemented with semiconductor devices having temperature-dependent junctions in only one branch (for either node 412 or node 414) for a single-sided configuration.

Figure 10A:
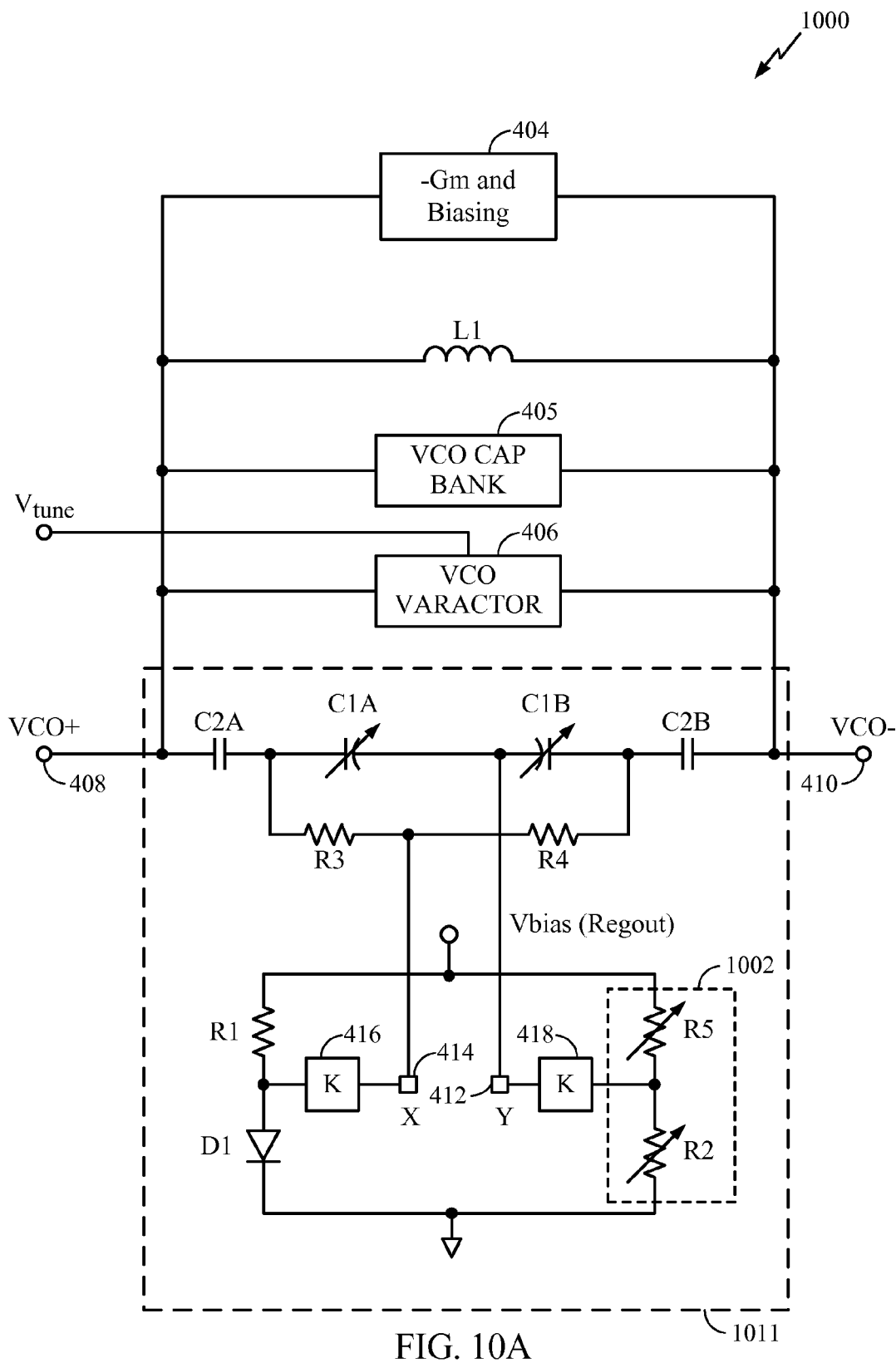
FIGS. 10A and 10B are schematic diagrams of example VCOs with temperature-dependent adjustment circuits implemented with a biasing circuit in one branch and a set of semiconductor devices with temperature-dependent junctions in the other branch, in accordance with certain aspects of the present disclosure.

For example, FIG. 10A illustrates another example VCO 1000 with a temperature-dependent adjustment circuit 1011, in accordance with certain aspects of the present disclosure. Adjustment circuit 1011 is implemented with a biasing circuit 1002 in one branch and a set of one or more semiconductor devices with temperature-dependent p-n junctions in the other branch. The set of semiconductor devices is represented in FIG. 10A by diode D1, but also could also be implemented with a stack of diodes or a set of one or more diode-connected transistors, as described above. The biasing circuit 1002 may be implemented with a voltage divider, which may include two resistors R2 and R5 as shown. Either or both of the resistors R2, R5 may be adjustable for certain aspects.

Assuming that optional circuits 416, 418 are not present and effectively shorted, the adjustment voltage at node 414 (Vx) is equal to the forward voltage across diode D1 ($V_{F1}$), and the bias voltage at node 412 (Vy) is equal to a divided down version of the bias voltage (Vy=Vbias*R2/(R5+R2)). Therefore, the voltage difference Vy−Vx is equal to Vbias*R2/(R5+R2)−$V_{F1}$. If Vbias and the resistance values R2 and R5 are constant with changes in temperature, then one can see that the temperature coefficient of the voltage difference Vy−Vx is basically the negative of the temperature coefficient for a single diode. So for a single Si diode, the temperature coefficient of the voltage difference Vy−Vx would effectively be +1.8 mV/° C. The temperature sensitivity may be increased using a stack of diodes or diode-connected transistors for diode D1 as described above. Additionally or alternatively, the optional circuit 416 may be implemented with a scaling circuit to amplify the temperature sensitivity, as described above.

Figure 10B:
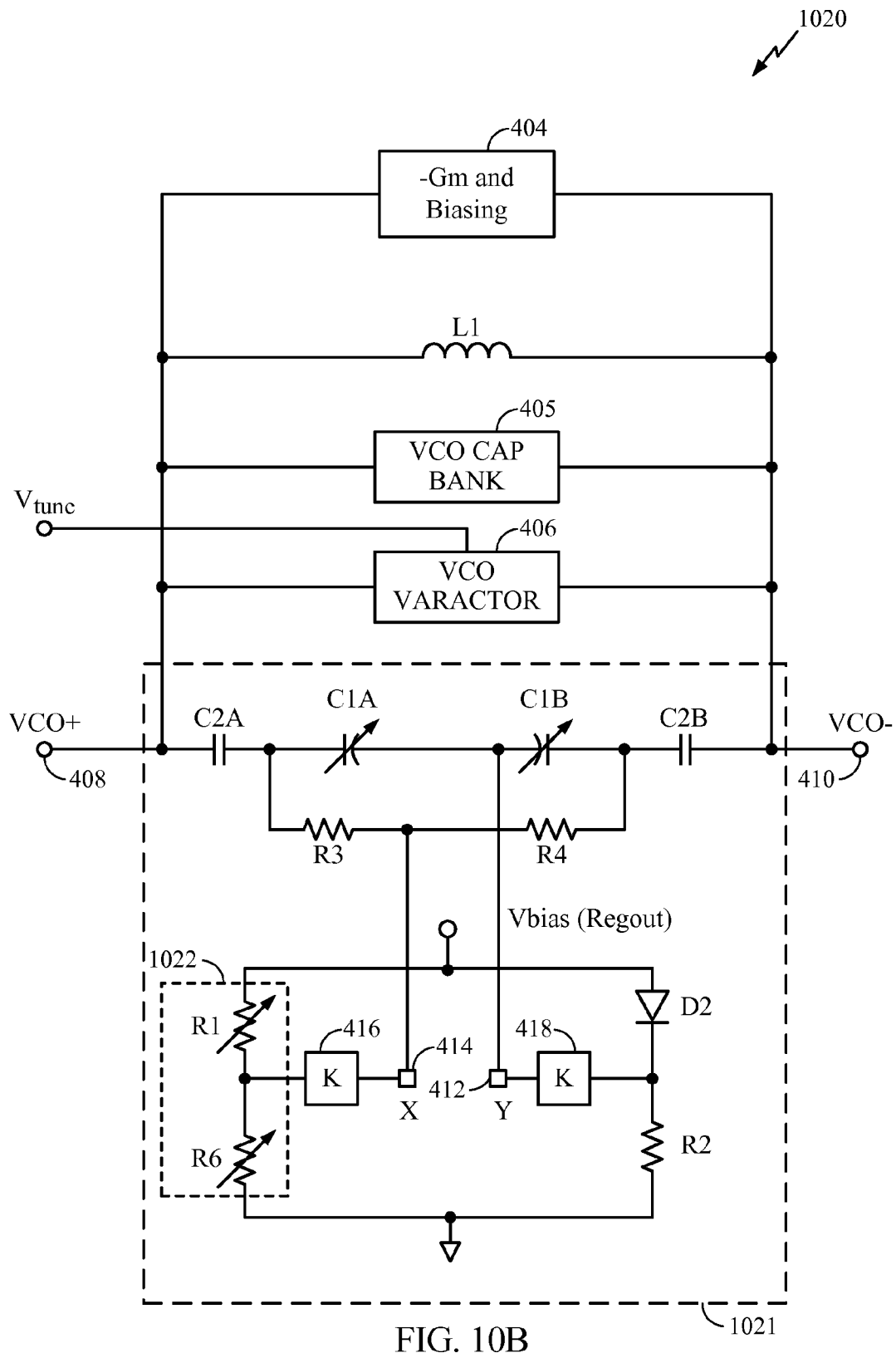

FIG. 10B illustrates another example VCO 1020 with a temperature-dependent adjustment circuit 1021, in accordance with certain aspects of the present disclosure. Adjustment circuit 1021 is implemented with a biasing circuit 1022 in one branch and a set of one or more semiconductor devices with temperature-dependent p-n junctions in the other branch. The set of semiconductor devices is represented in FIG. 10B by diode D2, but also could also be implemented with a stack of diodes or a set of one or more diode-connected transistors, as described above. The biasing circuit 1022 may be implemented with a voltage divider, which may include two resistors R1 and R6 as shown. Either or both of the resistors R1, R6 may be adjustable for certain aspects.

Assuming that optional circuits 416, 418 are not present and effectively shorted, the bias voltage at node 414 (Vx) is equal to a divided down version of the bias voltage (Vx=Vbias*R6/(R1+R6)), and the adjustment voltage at node 412 (Vy) is equal to the difference between the bias voltage and forward voltage across diode D2 (VF2). Therefore, the voltage difference Vy–Vx is equal to Vbias–$V_{F2}$–Vbias*R6/(R1+R6). If Vbias and the resistance values R1 and R6 are constant with changes in temperature, then one can see that the temperature coefficient of the voltage difference Vy–Vx is basically the negative of the temperature coefficient for a single diode, similar to the implementation in FIG. 10B. The temperature sensitivity may be increased using a stack of diodes or diode-connected transistors for diode D2 as described above. Additionally or alternatively, the optional circuit 418 may be implemented with a scaling circuit to amplify the temperature sensitivity, as described above.

Figure 11:
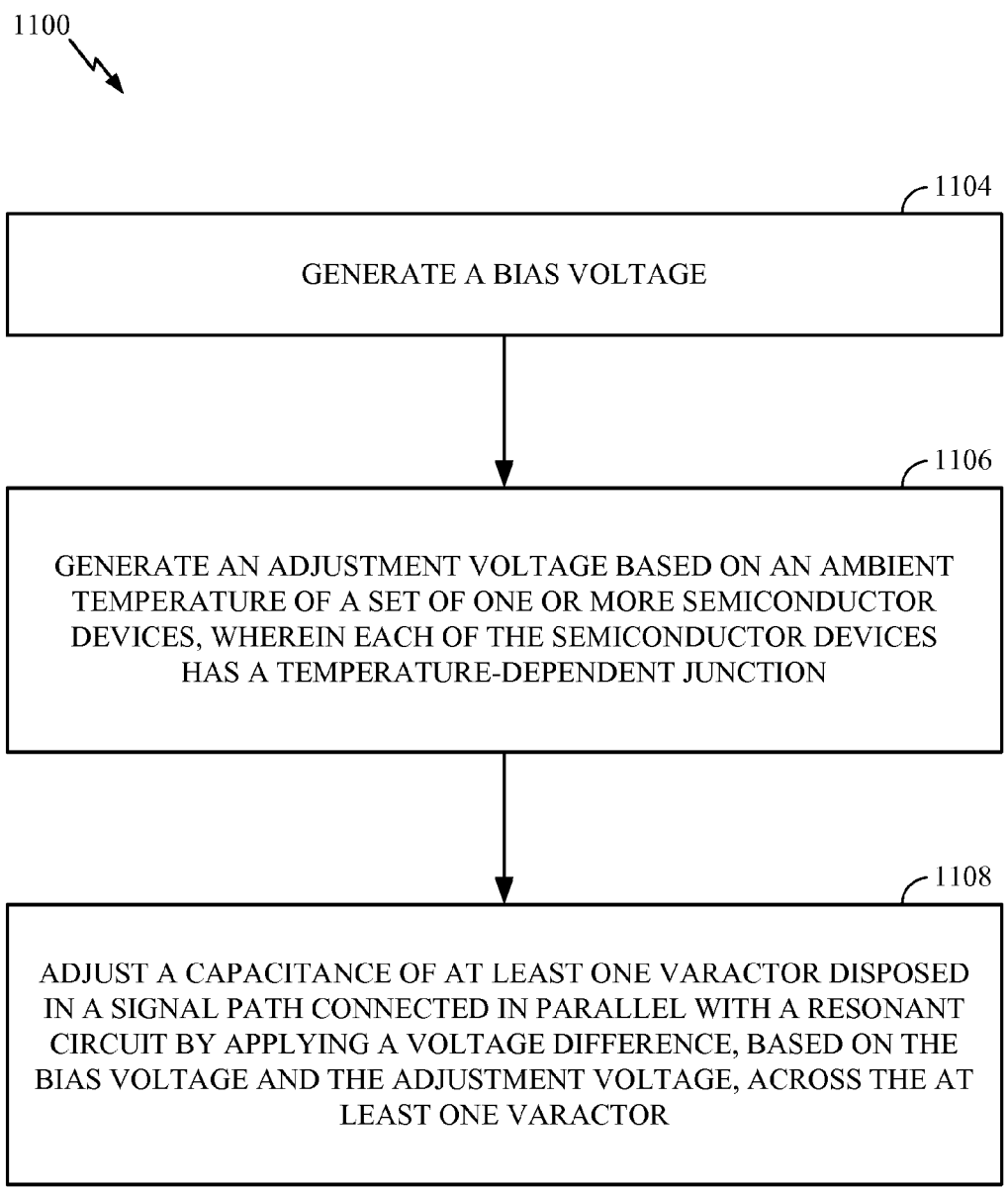
FIG. 11 is a flow diagram of example operations for temperature adjustment of a resonant circuit, in accordance with certain aspects of the present disclosure.

FIG. 11 is a flow diagram of example operations 1100 for temperature-dependent adjustment of a resonant circuit, in accordance with certain aspects of the present disclosure. The operations 1100 may be performed by an apparatus, such as a VCO having a resonant circuit and a temperature-dependent adjustment circuit (e.g., VCO 1000 with resonant circuit 402 and adjustment circuit 1011 illustrated in FIG. 10A).

The operations 1100 may begin, at block 1104, with the apparatus generating a bias voltage. For example, the bias voltage may be generated using a biasing circuit (e.g., biasing circuit 1002).

At block 1106, the apparatus may generate an adjustment voltage based on an ambient temperature of a set of one or more semiconductor devices. Each of the semiconductor devices in the set may have a temperature-dependent junction.

At block 1108, the apparatus may adjust a capacitance of at least one varactor (e.g., varactors C1A, C1B) disposed in a signal path connected in parallel with the resonant circuit by applying a voltage difference (e.g., Vy–Vx), based on the bias voltage and the adjustment voltage, across the at least one varactor. For certain aspects, the voltage difference is derived from the adjustment voltage subtracted from the bias voltage, or vice versa. For certain aspects, the capacitance of the at least one varactor is inversely proportional to the square root of the voltage difference applied across the at least one varactor.

According to certain aspects, the operations 1100 may further involve the apparatus generating a periodic signal using the resonant circuit. The periodic signal has a frequency (e.g., the VCO oscillation frequency) with a negative temperature coefficient for certain aspects. For certain aspects, adjusting the capacitance of the at least one varactor at block 1108 reduces a magnitude of the negative temperature coefficient of the frequency. For certain aspects, as the ambient temperature of the set of semiconductor devices increases, a junction voltage of the temperature-dependent junction is configured to decrease, the voltage difference is configured to increase, and the capacitance of the at least one varactor is configured to decrease. As the ambient temperature of the set of semiconductor devices increases for certain aspects, the adjustment voltage is configured to decrease such that the voltage difference is configured to increase. For other aspects, the adjustment voltage is configured to increase as the ambient temperature of the set of semiconductor devices increases, such that the voltage difference is configured to increase. According to certain aspects, as the ambient temperature of the set of semiconductor devices increases, an overall capacitance of the signal path connected in parallel with the resonant circuit is configured to decrease and the frequency of the periodic signal is configured to increase, compared to the resonant circuit without the signal path at the ambient temperature.

According to certain aspects, the set of semiconductor devices includes one or more diodes (e.g., connected in series) and/or one or more diode-connected transistors. For example, the diode-connected transistors may include diode-connected NMOS transistors or BJTs.

According to certain aspects, each device in the set of semiconductor devices has a negative temperature coefficient.

According to certain aspects, the operations 1100 may further entail the apparatus at least one of level shifting or scaling a magnitude of the adjustment voltage before applying the voltage difference across the at least one varactor at block 1108.

According to certain aspects, the operations 1100 further include the apparatus biasing the set of semiconductor devices (e.g., using a bias voltage source). For certain aspects, generating the bias voltage at block 1104 involves dividing the bias voltage source using an adjustable voltage divider.

The various operations or methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for transmitting may comprise a transmitter or transceiver (e.g., the transceiver front-end 254 of the user terminal 120 depicted in FIG. 2, the transceiver front-end 222 of the access point 110 shown in FIG. 2, or the transceiver front-end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front-end 300 depicted in FIG. 3). Means for receiving may comprise a receiver or transceiver (e.g., the transceiver front-end 254 of the user terminal 120 depicted in FIG. 2, the transceiver front-end 222 of the access point 110 shown in FIG. 2, or the transceiver front-end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front-end 300 depicted in FIG. 3). Means for processing or means for determining may comprise a processing system, which may include one or more processors (e.g., the TX data processor 210, the RX data processor 242, and/or the controller 230 of the access point 110 shown in FIG. 2, or the RX data processor 270, the TX data processor 288, and/or the controller 280 of the user terminal 120 illustrated in FIG. 2).

Means for generating a differential adjustment voltage may comprise a temperature-dependent adjustment circuit (e.g., the adjustment circuit 411, 511, or 611 depicted in FIG. 4, 5, or 6, respectively). Means for adjusting a capacitance of at least one varactor may comprise a varactor (e.g., varactor C1A or C1B) and circuitry for applying the voltage difference across the varactor, such as the resistor R3 or R4 shown in FIGS. 4-6, 10A, and 10B). Means for generating a bias voltage may include a biasing circuit (e.g., biasing circuit 1002 illustrated in FIG. 10A or biasing circuit 1022 illustrated in FIG. 10B). Means for generating an adjustment voltage may comprise one or more one or more semiconductor devices having a temperature-dependent junction (e.g., diode D1 and resistor R1 in FIG. 10A or diode D2 and resistor R2 in FIG. 10B).

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an application-specific integrated circuit (ASIC), a field-programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation, and details of the methods and apparatus described above without departing from the scope of the claims.

What is claimed is:

1. An adjustment circuit for temperature-dependent adjustment of a resonant circuit, comprising:
    at least one varactor having a first terminal and a second terminal;
    a first set of one or more semiconductor devices connected with the first terminal and configured to generate a first adjustment voltage; and
    a second set of one or more semiconductor devices connected with the second terminal and configured to generate a second adjustment voltage, wherein:
    each device in the first and second sets of semiconductor devices has a temperature-dependent junction;
    the first and second adjustment voltages are based on an ambient temperature affecting the temperature-dependent junction of each device in the first and second sets of semiconductor devices, respectively;
    a differential adjustment voltage based on a difference between the first and second adjustment voltages is applied to the first and second terminals to adjust a capacitance of the at least one varactor; and
    voltage changes due to changes in the ambient temperature affecting the temperature-dependent junctions in the first and second sets of semiconductor devices are added in the differential adjustment voltage.

2. The adjustment circuit of claim 1, wherein the first and second sets of semiconductor devices are connected with the first and second terminals, respectively, of the at least one varactor without an amplifier or a filter connected therebetween.

3. The adjustment circuit of claim 1, wherein each set of semiconductor devices comprises one or more diode-connected bipolar junction transistors (BJTs).

4. The adjustment circuit of claim 1, further comprising one or more scaling circuits connected between the first and second sets of semiconductor devices and the first and second terminals, respectively, and configured to scale a magnitude of the differential adjustment voltage, wherein the scaled differential adjustment voltage is applied to the first and second terminals.

5. The adjustment circuit of claim 1, wherein:
    the at least one varactor comprises a first varactor connected in series with a second varactor;

the first and second sets of semiconductor devices are configured to apply the differential adjustment voltage across the first varactor and across the second varactor; and an anode of the first varactor is connected with an anode of the second varactor.

6. The adjustment circuit of claim 5, further comprising:
a first impedance connected with a cathode of the first varactor; and
a second impedance connected with a cathode of the second varactor, wherein the adjustment circuit is configured to apply the differential adjustment voltage from the anode of the first varactor to the first impedance and from the anode of the second varactor to the second impedance.

7. The adjustment circuit of claim 1, wherein the capacitance of the at least one varactor is inversely proportional to the square root of the differential adjustment voltage applied to the first and second terminals.

8. The adjustment circuit of claim 1, further comprising:
a bias voltage source configured to bias the first and second sets of semiconductor devices;
a first impedance connected between the bias voltage source and the first set of semiconductor devices, wherein the first set of semiconductor devices is connected with a reference potential for the bias voltage source; and
a second impedance connected between the second set of semiconductor devices and the reference potential, wherein the second set of semiconductor devices is connected with the bias voltage source.

9. The adjustment circuit of claim 1, wherein each set of semiconductor devices comprises one or more diodes connected in series, each diode having a negative temperature coefficient, and wherein the first and second sets of semiconductor devices are configured such that the voltage changes due to the negative temperature coefficients of the one or more diodes in the first and second sets of semiconductor devices are added in the differential adjustment voltage.

10. The adjustment circuit of claim 1, further comprising one or more level shifting circuits connected between the first and second sets of semiconductor devices and the first and second terminals, respectively, and configured to level shift the differential adjustment voltage, wherein the level-shifted differential adjustment voltage is applied to the first and second terminals.

11. A method for temperature-dependent adjustment of a resonant circuit, comprising:
generating a differential adjustment voltage based on an ambient temperature of two sets of semiconductor devices, wherein each device in the sets of semiconductor devices has a temperature-dependent junction and wherein the two sets of semiconductor devices are configured such that effects of the temperature-dependent junctions from the two sets of semiconductor devices are combined in the differential adjustment voltage; and
adjusting a capacitance of at least one varactor disposed in a signal path connected in parallel with the resonant circuit by applying the differential adjustment voltage across the at least one varactor.

12. The method of claim 11, further comprising generating a periodic signal using the resonant circuit, wherein the periodic signal has a frequency with a negative temperature coefficient.

13. The method of claim 12, wherein adjusting the capacitance of the at least one varactor reduces a magnitude of the negative temperature coefficient of the frequency.

14. The method of claim 12, wherein as the ambient temperature of the two sets of semiconductor devices increases:
junction voltages of the temperature-dependent junctions are configured to decrease;
the differential adjustment voltage is configured to increase;
the capacitance of the at least one varactor is configured to decrease; an overall capacitance of the signal path connected in parallel with the resonant circuit is configured to decrease; and
the frequency of the periodic signal is configured to increase, compared to the resonant circuit without the signal path at the ambient temperature.

15. The method of claim 11, wherein each set of semiconductor devices comprises one or more diodes.

16. The method of claim 11, further comprising at least one of level shifting or scaling a magnitude of the generated differential adjustment voltage before applying the differential adjustment voltage across the at least one varactor.

17. The method of claim 11, further comprising biasing the two sets of semiconductor devices using a bias voltage source.

18. An adjustment circuit for temperature-dependent adjustment of a resonant circuit, comprising:
at least one varactor having a first terminal and a second terminal, wherein the at least one varactor is disposed in a signal path connected in parallel with the resonant circuit;
a biasing circuit connected with the first terminal and configured to generate a bias voltage for applying to the first terminal; and
a set of one or more semiconductor devices connected with the second terminal and configured to generate an adjustment voltage for applying to the second terminal based on an ambient temperature of the one or more semiconductor devices to adjust a capacitance of the at least one varactor, wherein each device in the set of semiconductor devices has a temperature-dependent junction.

19. The adjustment circuit of claim 18, wherein the set of semiconductor devices is connected with the second terminal without an amplifier or a filter connected therebetween.

20. The adjustment circuit of claim 18, wherein the set of semiconductor devices comprises one or more diode-connected n-channel metal-oxide-semiconductor (NMOS) transistors.

21. The adjustment circuit of claim 18, further comprising a scaling circuit connected between the set of semiconductor devices and the second terminal and configured to scale a magnitude of the adjustment voltage, wherein the scaled adjustment voltage is applied to the second terminal.

22. The adjustment circuit of claim 18, wherein:
the at least one varactor comprises a first varactor connected in series with a second varactor;
the set of semiconductor devices is configured to generate the adjustment voltage for applying to the second terminal of the first varactor and to the second terminal of the second varactor;
the biasing circuit is configured to generate the bias voltage for applying to the first terminal of the first varactor and to the first terminal of the second varactor;
the first terminal of the first varactor comprises an anode of the first varactor;

the first terminal of the first varactor is connected with the first terminal of the second varactor; and the first terminal of the second varactor comprises an anode of the second varactor.

23. The adjustment circuit of claim 22, further comprising:

a first impedance connected with the second terminal of the first varactor, wherein the second terminal of the first varactor comprises a cathode of the first varactor; and a second impedance connected with the second terminal of the second varactor, wherein the second terminal of the second varactor comprises a cathode of the second varactor and wherein the set of semiconductor devices is configured to apply the adjustment voltage to the first impedance and to the second impedance.

24. The adjustment circuit of claim 18, wherein the capacitance of the at least one varactor is inversely proportional to the square root of a voltage difference between the bias voltage and the adjustment voltage applied across the at least one varactor.

25. The adjustment circuit of claim 18, further comprising a bias voltage source configured to bias at least one of the biasing circuit or the set of semiconductor devices, wherein the biasing circuit comprises:

a first impedance connected between the bias voltage source and the first terminal; and a second impedance connected between the first terminal and a reference potential for the bias voltage source.

26. The adjustment circuit of claim 18, further comprising a level shifting circuit connected between the set of semiconductor devices and the second terminal and configured to level shift the adjustment voltage, wherein the level-shifted adjustment voltage is applied to the second terminal.

27. A method for temperature-dependent adjustment of a resonant circuit, comprising:

generating a bias voltage;

generating an adjustment voltage based on an ambient temperature of a set of one or more semiconductor devices, wherein each device in the set of semiconductor devices has a temperature-dependent junction; and adjusting a capacitance of at least one varactor disposed in a signal path connected in parallel with the resonant circuit by applying a voltage difference, based on the bias voltage and the adjustment voltage, across the at least one varactor.

28. The method of claim 27, further comprising generating a periodic signal using the resonant circuit, wherein the periodic signal has a frequency with a negative temperature coefficient and wherein as the ambient temperature of the set of semiconductor devices increases:

a junction voltage of the temperature-dependent junction is configured to decrease;

the voltage difference is configured to increase;

the capacitance of the at least one varactor is configured to decrease;

the adjustment voltage is configured to decrease such that the voltage difference is configured to increase;

an overall capacitance of the signal path connected in parallel with the resonant circuit is configured to decrease; and the frequency of the periodic signal is configured to increase, compared to the resonant circuit without the signal path at the ambient temperature.

29. The method of claim 27, further comprising at least one of level shifting or scaling a magnitude of the adjustment voltage before applying the voltage difference across the at least one varactor.

30. The method of claim 27, further comprising biasing the set of semiconductor devices using a bias voltage source, wherein generating the bias voltage comprises dividing the bias voltage source using an adjustable voltage divider.

* * * * *